(12) United States Patent
Wang

(10) Patent No.: US 10,203,424 B2
(45) Date of Patent: Feb. 12, 2019

(54) STUD SENSOR

(71) Applicants: Hangzhou Great Star Tools Co., Ltd., Zhejiang (CN); Hangzhou Great Star Industrial Co., Ltd., Zhejiang (CN)

(72) Inventor: Weiyi Wang, Zhejiang (CN)

(73) Assignees: Hangzhou Great Star Tools Co., Ltd. (CN); Hangzhou Great Star Industrial Co., Ltd. (CN)

( * ) Notice: Subject to any disclaimer, the term of this patent is extended or adjusted under 35 U.S.C. 154(b) by 115 days.

(21) Appl. No.: 15/326,954

(22) PCT Filed: Jul. 24, 2014

(86) PCT No.: PCT/CN2014/082880
§ 371 (c)(1),
(2) Date: Jan. 17, 2017

(87) PCT Pub. No.: WO2016/008170
PCT Pub. Date: Jan. 21, 2016

(65) Prior Publication Data
US 2017/0205525 A1    Jul. 20, 2017

(30) Foreign Application Priority Data

Jul. 17, 2014  (CN) .......................... 2014 1 0342483
Jul. 18, 2014  (CN) .......................... 2014 1 0344190

(51) Int. Cl.
*G01V 3/02*    (2006.01)
*G01R 27/26*   (2006.01)
*G01V 3/08*    (2006.01)

(52) U.S. Cl.
CPC ........... *G01V 3/02* (2013.01); *G01R 27/2605* (2013.01); *G01V 3/08* (2013.01)

(58) Field of Classification Search
CPC ............................. G01V 3/02; G01R 27/2605
See application file for complete search history.

(56) References Cited

U.S. PATENT DOCUMENTS 5,812,057 A * 9/1998 Hepworth .............. G01V 3/088
307/116
2005/0194959 A1* 9/2005 Miller .................... G01V 3/088
324/67

(Continued)

FOREIGN PATENT DOCUMENTS

CN        2641648 Y      9/2004
CN        2748931 Y     12/2005
(Continued)

OTHER PUBLICATIONS

International Search Report and Written Opinion of PCT/CN2014/082880, dated Apr. 1, 2015, 9 pages.
(Continued)

*Primary Examiner* — Tung X Nguyen
*Assistant Examiner* — Dominic Hawkins
(74) *Attorney, Agent, or Firm* — Blank Rome LLP

(57) ABSTRACT

The present invention discloses a stud sensor, which is used for detecting the object hidden behind a surface, including a first capacitor plate, a second capacitor plate, a first detection circuit coupled to the first capacitor plate, a second detection circuit coupled to the second capacitor plate and a micro control unit. The first detection circuit processes the voltage signal corresponding to the first capacitance of the first capacitor plate and outputs a first voltage signal to the micro control unit. The second detection circuit processes the voltage signal corresponding to the second capacitance of the second capacitor plate and outputs a second voltage signal to the micro control unit. The micro control unit compares the first voltage signal and the second voltage signal to determine the position information including the central position of the object. The stud sensor of the invention also includes an output module to show the position information of the object, an input module to input instructions to the micro control unit. The invention has the (Continued)

properties of small size, high integration, fast response speed, high precision and good anti-interference.

17 Claims, 3 Drawing Sheets

(56) References Cited

U.S. PATENT DOCUMENTS

| | | |
|---|---|---|
| 2005/0253597 A1 | 11/2005 | Miller |
| 2007/0041568 A1* | 2/2007 | Ghoshal ................. H04L 12/10 379/324 |
| 2007/0210785 A1* | 9/2007 | Sanoner ............... G01R 29/085 324/67 |
| 2008/0238403 A1* | 10/2008 | Sanoner ................ G01V 3/088 324/67 |
| 2012/0159207 A1* | 6/2012 | Chao ..................... G06F 1/3275 713/310 |

FOREIGN PATENT DOCUMENTS

| | | |
|---|---|---|
| CN | 2788931 Y | 12/2005 |
| CN | 1811488 A | 8/2006 |
| CN | 203012151 U | 6/2013 |
| CN | 203981898 U | 12/2014 |

OTHER PUBLICATIONS

Dong-po Chen et al., "Study and Design of an on Chip Clock Generator with High Stability", Journal of Circuits and Systems, 2006, vol. 11, No. 3, pp. 14-17 w/English-language Abstract.

\* cited by examiner

STUD SENSOR

RELATED APPLICATIONS

This application is a national phase of PCT/CN2014/082880, filed on Jul. 24, 2014, which claims the benefit of Chinese Patent Application No. 201410342483.3, filed on Jul. 17, 2014 and Chinese Patent Application No. 201410344190.9, filed on Jul. 18. 2014. The content of these applications are hereby incorporated by reference.

FIELD OF THE INVENTION

The invention relates to a sensor and, particularly, relates to a stud sensor.

DESCRIPTION OF THE PRIOR ART

Generally, the sensor used for detecting objects hidden behind a surface, for example, objects such as wood, metal and other materials inside a wall, is referred to as a stud sensor. In construction and decoration field, the stud sensor is a very useful tool, which can detect hidden objects, so as to assist the user to locate them to proceed with the subsequent operations, for example, uprooting the iron nails left in a wall, drilling holes on a wall, etc.

Currently, the common stud sensors are mostly capacitance-based electronic devices, that is because most objects hidden behind a surface have a permittivity different from that of the surrounding substances, thus the hidden objects can be detected as long as the changes of the permittivity can be detected. Normally, the stud sensor has a detection face for coming close to the surface to be detected, and the detection face is arranged with one or more capacitor plates thereon. In use, the detection face reaches close to the surface (such as a wall surface) to be detected, and moves over the surface. When the stud sensor detects a change in the capacitance value of the capacitor plates, it can be determined that there is a hidden object behind the surface at this location. An advanced stud sensor can also determine the boundary, center, material and so fourth of the hidden object.

With the development of science and technology, the development trend of various electronic devices has been toward being small in size, highly integrated and fast in response speed, and producing a stud sensor with small size, high integration and fast response speed is an object for those skilled in the field, and, also, a stud sensor with smaller size, higher integration and faster response speed can better satisfy the requirement of the user.

Accordingly, people skilled in the field have been endeavoring in developing a stud sensor, which can realize small size, high integration and fast response speed.

SUMMARY OF THE INVENTION

In view of the above defects in the prior art, the technical problem to solved by the invention is to provide a stud sensor, realizing small size, high integration and fast response speed by using integrated circuit chip.

In order to achieve the above object, the invention provides a stud sensor, used for detecting an object hidden behind a surface, a detection face of the stud sensor moves along the surface, characterized in that, the stud sensor comprises a first capacitor plate, a second capacitor plate, a first detection circuit, a second detection circuit and a micro control unit;

the first capacitor plate and the second capacitor plate are distributed on the detection face; the first capacitor plate and the surface forming a first capacitor having a first capacitance; the second capacitor plate and the surface forming a second capacitor having a second capacitance;

the first detection circuit is coupled to the first capacitor plate, the first detection circuit processes the electrical signal corresponding to the first capacitance and outputs a first voltage signal;

the second detection circuit is coupled to the second capacitor plate, the second detection circuit processes the electrical signal corresponding to the second capacitance and outputs a second voltage signal;

an output end of the first detection circuit is connected to a first input end of the micro control unit, an output end of the second detection is connected to a second input end of the micro control unit; the micro control unit compares the first voltage signal and the second voltage signal, and determines the position of the object according to the result of the comparison.

Further, the micro control unit is an AD micro control unit.

Further, the first capacitor plate and the second capacitor plate have identical structural parameters and permittivity.

Further, on the detection face, the first capacitor plate and the second capacitor plate are arranged in parallel.

Further, each element and connections between each element in the first detection circuit and the second detection circuit are all identical.

Further, the micro control unit determines the central position of the object when the first voltage signal and the second voltage signal are equal.

Further, the first detection circuit comprises a first oscillator, the second detection circuit comprises a second oscillator, an input end of the first oscillator connected to a first PWM channel of the micro control unit, an input end of the second oscillator connected to a second PWM channel.

Further, the first oscillator and the second oscillator are both RC oscillators.

Further, an output end of the first oscillator is connected to the first capacitor plate, an output end of the second oscillator is connected to the second capacitor plate.

Further, the first detection circuit includes a first flip-flop, the output end of the first oscillator connected to a first input end of the first flip-flop; the second detection circuit comprises a second flip-flop, the output end of the second oscillator connected to a first input end of the second flip-flop.

Further, the first flip-flop and the second flip-flop are both CD4093 flip-flops.

Further, the stud sensor also comprises a power supply module which is respectively connected to the micro control unit, the first detection circuit and the second detection circuit so as to supply power.

Further, the power supply module comprises a power supply and a regulated power supply chip, the power supply connected to an input end of the regulated power supply chip, an output end of the regulated power supply chip respectively connected to the micro control unit, the first detection circuit and the second detection circuit.

Further, the power supply module has an indicator light.

Further, the power supply is a battery pack.

Further, the stud sensor further comprises an output module, an input end of the output module connected to an output end of the micro control unit.

Further, the output module is a display.

Further, the stud sensor further comprises an input module, an output end of the input module connected to a third input end of the micro control unit.

Further, the input module is a keyboard.

In a preferred embodiment of the invention, a stud sensor is provided for detecting an object hidden behind a surface, the detection face of which is arranged in parallel with a first capacitor plate and a second capacitor plate with identical structural parameters and permittivity. The first and second capacitor plates respectively form a first capacitor and a second capacitor in relation to the surface (and the object behind it) to be detected. The first and second capacitors have a first and a second capacitance, respectively. The stud sensor also includes a micro control unit, a first detection circuit, a second detection circuit, a power supply module, an output module and an input module. The first and second detection circuits respectively include a first oscillator and a second oscillator respectively connected to the first capacitor plate and the second capacitor plate. The first and second detection circuits also include a plurality of CD4093 flip-flops. The first and second detection circuits respectively implement processes of denoising and amplification to the electrical signals corresponding to the first and second capacitances then acquire a first voltage signal and a second voltage signal. The micro control unit compares the first and second voltage signals, acquires the position information of the object and displays the position information on the output module, the output module being a liquid crystal display. The input module is a keyboard, used for inputting instructions to the micro control unit by the user. The power supply module supplies power to the micro control unit, the first and second detection circuits respectively. It can thus be seen that the stud sensor of the present invention greatly enhances the integration level and response speed of the device by using the micro control unit, and greatly enhances the precision and anti-interference capability by using the first and second detection circuits with oscillators and CD4093 flip-flops and the acquired first and second voltage signals, so the stud sensor is enabled to have properties of small size, high integration, fast response speed, high precision and good anti-interference.

Referencing now to the figures, the conception, detailed structure and induced technical effect of the present invention will be further expounded for a full understanding of the purpose, characterizations and effects of the present invention.

DETAILED DESCRIPTION OF THE PREFERRED EMBODIMENTS

Figure 2:
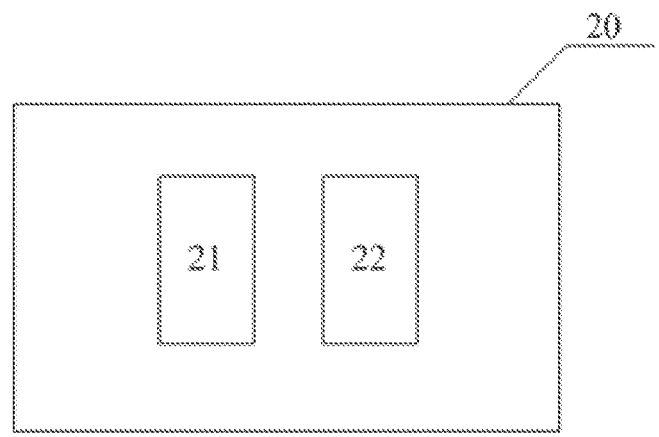
FIG. 2 shows the arrangement of the two capacitor plates of the stud sensor on the detection face, in a preferred embodiment of the invention.

The stud sensor of the invention is used for detecting an object hidden behind a surface, which has a detection face 20 (FIG. 2). In use, the detection face 20 is attached to or put close to the surface to be detected and moves along the surface.

Figure 1:
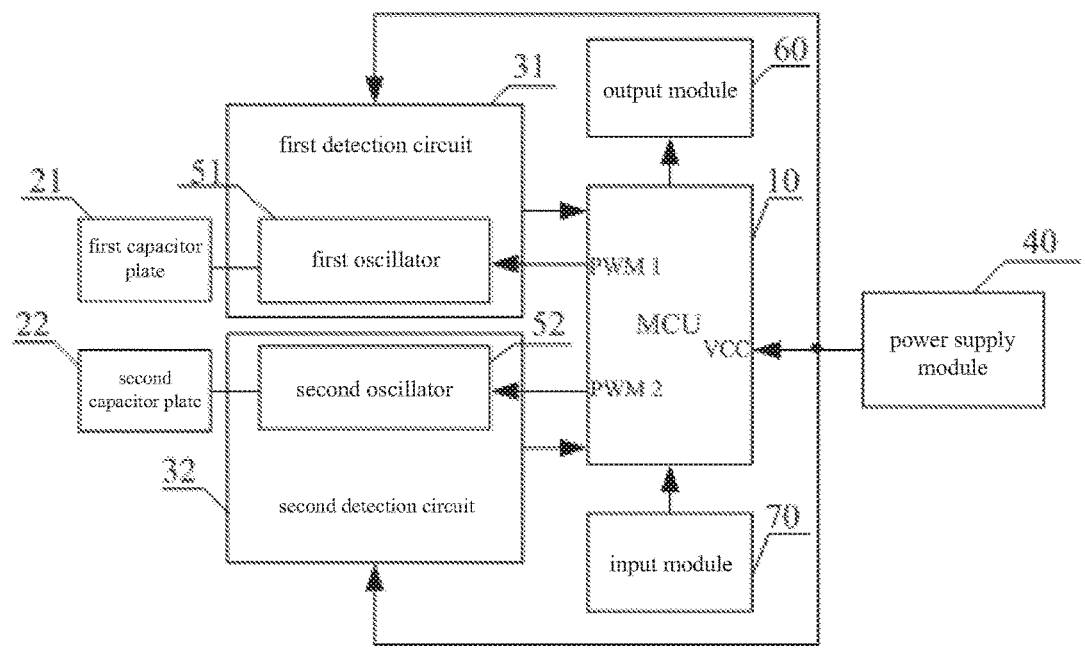
FIG. 1 is a structural view of the module of the stud sensor in a preferred embodiment of the invention.

As shown in FIG. 1, in a preferred embodiment, the stud sensor of the invention includes a micro control unit 10, a first capacitor plate 21, a second capacitor plate 22, a first detection circuit 31, a second detection circuit 32 and a power supply module 40. The first capacitor plate 21 and the second capacitor plate 22 have identical structural parameters and permittivity, as shown in FIG. 2, and they are arranged in parallel on the detection face 20. When the detection face 20 is attached to or put close to the surface to be detected, the first capacitor plate 21 and the second capacitor plate 22 respectively form a first capacitor and a second capacitor in relation to the surface (and the object behind it) to be detected. The first capacitor has a first capacitance. The second capacitor has a second capacitance. The micro control unit 10 is an AD micro control unit.

Figure 3:
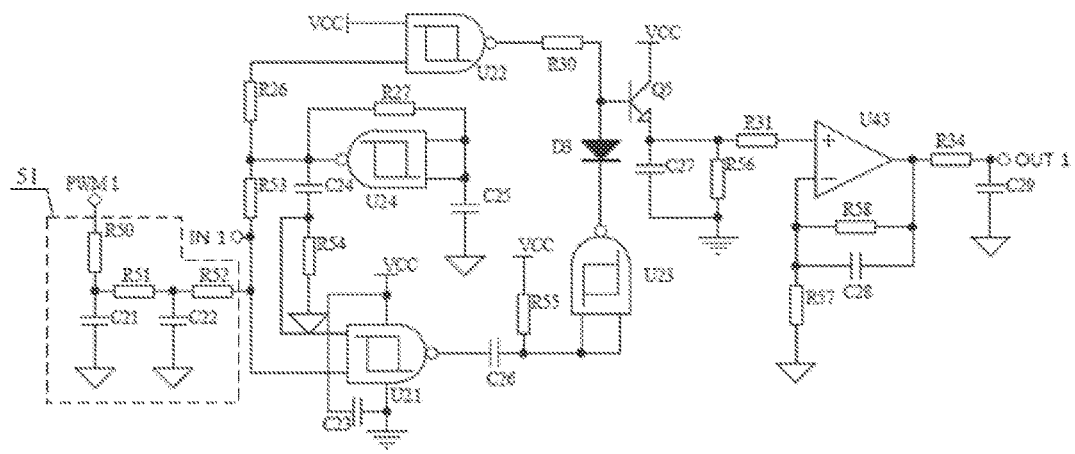
FIG. 3 shows the circuit structure of the first detection circuit of the stud sensor in a preferred embodiment of the invention.

As shown in FIG. 3, the first detection circuit 31 has an input end IN 1 and an output end OUT 1, wherein the input end IN 1 is connected to the first capacitor plate 21. The output end OUT 1 is connected to a first input end of the micro control unit 10. The first detection circuit 31 includes a first oscillator 51, the input end of the first oscillator 51 is connected to the first PWM channel PWM 1 of the micro control unit 10, and the output end of the first oscillator 51 is connected to the first capacitor plate 21. The first detection circuit 31 also includes a first flip-flop U21, the first flip-flop U21 is a CD4093 flip-flop, and the output of the first oscillator 51 is connected to a first input end of the first flip-flop U21.

In this embodiment, the first oscillator 51 consists of resistors R50, R51, R52 and capacitors C21, C22, in which, the resistors R50, R51 and R52 are connected in series. One end of the capacitor C21 is connected between the resistor R50 and the resistor R51, and the other end is grounded. One end of the capacitor C22 is connected between the resistor R51 and the resistor R52, and the other end is grounded. Preferably, the selected resistance value of the resistance R50, R51 and R52 are respectively 1 KΩ, 1 KΩ and 820 KΩ. The capacitances of the selected capacitors C21 and C22 are both 104 µF. The first oscillator 51 outputs a voltage signal having a first oscillation frequency.

In this embodiment, the first detection circuit 31 also includes the following elements: flip-flop U22, flip-flop U23, flip-flop U24, amplifier U43, transistor Q5, resistors R26, R53, R54, R27, R30, R55, R56, R31, R58, R57 and R34, capacitors C24, C23, C25, C26, C27, C28 and C29, and diode D3. The connection relationship of these elements is shown in FIG. 3, which is not repeated herein. Preferably, the parameters of each of the selected elements are as follows:

Flip-flop U22, flip-flop U23 and flip-flop U24 are all CD4093 flip-flops;

The model of amplifier U43 is LM324;

The model of diode D3 is IN4148;

Transistor Q5 is a transistor 9014;

The resistance values of resistors R26, R53, R54, R27, R30, R55, R56, R31, R58, R57 and R34 are respectively 120 KΩ, 33 KΩ, 10 KΩ, 47 KΩ, 10 KΩ, 10 KΩ, 470 KΩ, 100 KΩ, 470 KΩ, 150 KΩ and 1 KΩ;

The capacitance values of capacitors C24, C23, C25, C26, C27, C28 and C29 are respectively 471 µF, 104 µF, 471 µF, 471 µF, 105 µF, 103 µF and 104 µF.

Figure 4:
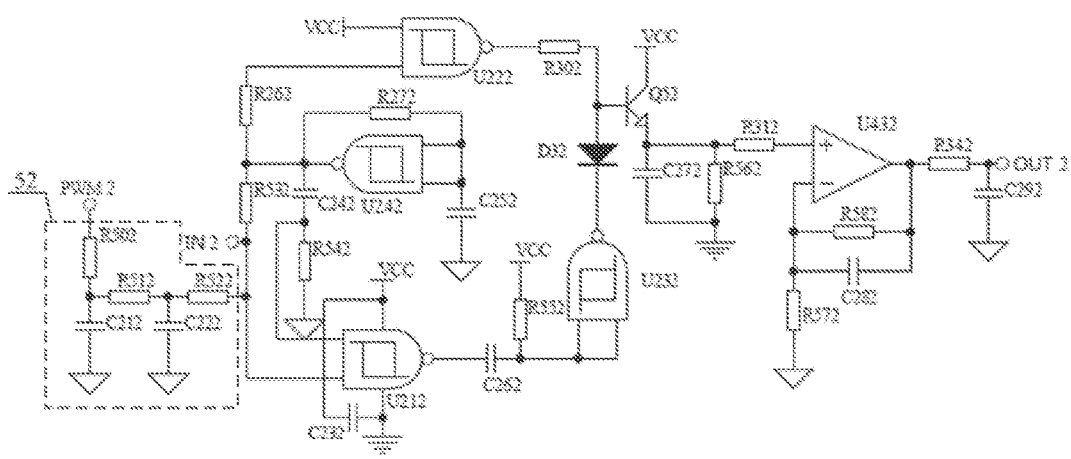
FIG. 4 shows the circuit structure of the second detection circuit of the stud sensor in a preferred embodiment of the invention.

As shown in FIG. 4, the second detection circuit 32 has an input end IN 2 and the output end OUT 2, in which the input end IN 2 is connected to the second capacitor plate 22, the output end OUT 2 is connected to a second input end of the micro control unit 10. The second detection circuit 32 includes a second oscillator 52, and the input end of the second oscillator 52 is connected to the second PWM channel PWM 2 of the micro control unit 10, the output end of the second oscillator 52 is connected to the second capacitor plate 22. The second detection circuit 32 also includes a second flip-flop U212, and the second flip-flop U212 is a CD4093 flip-flop. The output end of the second oscillator 52 is connected to the first input end of the second flip-flop U212.

In the present embodiment, the second oscillator 52 consists of resistors R502, R512, R522 and capacitors C212, C222, in which, the resistors R502, R512 and R522 are in series. One end of the capacitor C212 is connected between the resistor R502 and the resistor R512, and the other end is grounded. One end of the capacitor C222 is connected between the resistor R512 and the resistor R522, and the other end is grounded. Preferably, the resistance values of the selected resistances R502, R512 and R522 are respectively 1 KΩ, 1 KΩ and 820 KΩ. The capacitance values of the selected capacitors C212 and C222 are both 104 μF. The second oscillator 52 outputs a voltage signal having a second oscillation frequency, and in this embodiment the second oscillation frequency is equal to the first oscillation frequency.

In this embodiment, the second detection circuit 32 also includes the following elements: flip-flop U222, flip-flop U232, flip-flop U242, amplifier U432, transistor Q52, resistors R262, R532, R542, R272, R302, R552, R562, R312, R582, R572 and R342, capacitors C242, C232, C252, C262, C272, C282 and C292, and a diode D32. The connection relationship of these elements is shown in FIG. 4, and is not repeated herein. Preferably, the parameters of each of the selected elements are as follows:

Flip-flop U222, flip-flop U232 and flip-flop U242 are all CD4093 flip-flops;
The model of amplifier U432 is LM324;
The model of diode D32 is IN4148;
The transistor Q52 is a transistor 9014;
The resistance values of resistors R262, R532, R542, R272, R302, R552, R562, R312, R582, R572 and R342 are respectively 120 KΩ, 33 KΩ, 10 KΩ, 47 KΩ, 10 KΩ, 10 KΩ, 470 KΩ, 100 KΩ, 470 KΩ, 150 KΩ and 1 KΩ;
The capacitance values of capacitors C242, C232, C252, C262, C272, C282 and C292 are respectively 471 μF, 104 μF, 471 μF, 471 μF, 105 μF, 103 μF and 104 μF.

Figure 5:
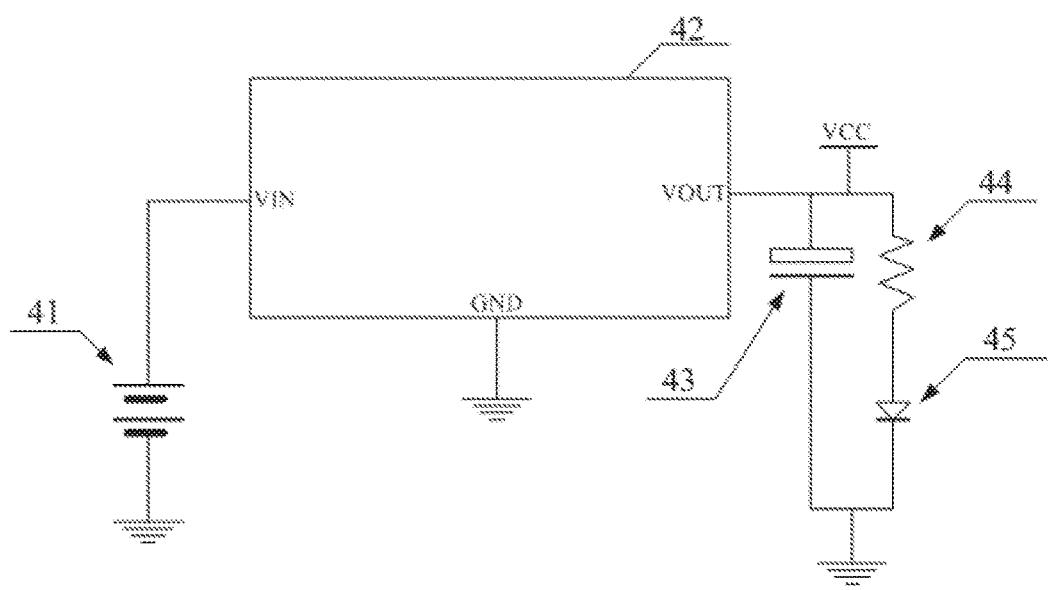
FIG. 5 shows the circuit structure of the power supply module of the stud sensor in a preferred embodiment of the invention.

The power supply module 40 is connected to the micro control unit 10, the first detection circuit 31 and the second detection circuit 32 respectively so as to supply power to them. As shown in FIG. 5, in this embodiment, the power supply module includes a power supply 41, a regulated power supply chip 42, a capacitor 43, a resistor 44 and a light emitting diode 45, in which, the power supply 41 is a battery pack, the positive pole of which is connected to the input end VIN of the regulated power supply chip 42, and the negative pole of which is grounded. The output end VOUT of the regulated power supply chip 42 is connected to pin VCC of the micro control unit 10 so as to supply power to the micro control unit 10, and the ground end of the regulated power supply chip 42 is grounded. The resistor 44 and the light-emitting diode 43 are in series and then in parallel with the capacitor 42, connected between the output end VOUT and ground. Further, by connecting the first detection circuit 31 and the second detection circuit 32 to the micro control unit pin VCC 10, a simultaneous power supply to the first detection circuit 31 and the second detection circuit 32 from the power supply module 40 can be achieved, the specific connection mode are shown as in FIGS. 3 and 4. The parameters and models of the selected resistor 44 and capacitor 43 can be determined according to actual requirement.

Thus, the changes of the first capacitance will affect the oscillation frequency of the voltage signal from the first oscillator 51 received by the first flip-flop U21 of the first detection circuit 31, and the other circuit portion of the first detection circuit 31 outputs a first voltage signal to the micro control unit 10 after implementing processes such as denoising, amplification to the voltage signal. In the same manner, the changes of the second capacitance will affect the oscillation frequency of the voltage signal from the second oscillator 52 received by the second flip-flop U212 of the second detection circuit 32, and the other circuit portion of the second detection circuit 32 outputs a second voltage signal to the micro control unit 10 after implementing processes such as denoising, amplification to the voltage signal. The micro control unit 10 compares the first voltage signal and the second voltage signal to obtain the position information of the object (including the central position of the object, for example, when the first voltage signal and the second voltage signal are equal, i.e., when both of which have the same amplitude and oscillation frequency, the location of the central position of the first capacitor plate 21 and the second capacitor plates 22 of the stud sensor at the time is determined to be the central position of object hidden behind the surface to be detected).

The stud sensor of the invention also includes an output module 60 connected at an output end of the micro control unit 10 used for displaying the position information of the hidden object obtained by the micro control unit 10. The output module 60 can be a display, such as a liquid crystal display, showing the position information of the object in text or image, and it can also be a loudspeaker sending the position information of the object in the form of sound, and further, it can also include both a display and a loudspeaker.

The stud sensor of the invention also includes an input module 70 connected at the third input end of the micro control unit 10 used for allowing the user to input instructions to the micro control unit 10, such as adjusting the oscillation frequency of the electrical signal output by PWM channels PWM 1 and PWM 2 of the micro control unit 10. The input module 70 in the present embodiment is a keyboard, including an entitative keyboard or a virtual keyboard formed on a liquid crystal display.

The foregoing described the preferred embodiments of the present invention. It should be understood that an ordinary one skilled in the art can make many modifications and variations according to the concept of the present invention without creative work. Therefore, any person skilled in the art can get any technical solution through logical analyses, deductions and limited experiments, which should fall in the protection scope defined by the claims.

The invention claimed is:

1. A stud sensor, used for detecting an object hidden behind a surface, a detection face of the stud sensor moves along the surface, characterized in that,
the stud sensor comprises a first capacitor plate, a second capacitor plate, a first detection circuit, a second detection circuit and a micro control unit;
the first capacitor plate and the second capacitor plate are distributed on the detection face; the first capacitor plate and the surface forming a first capacitor having a first capacitance; the second capacitor plate and the surface forming a second capacitor having a second capacitance;

the first detection circuit is coupled to the first capacitor plate, the first detection circuit processes the electrical signal corresponding to the first capacitance and outputs a first voltage signal;

the second detection circuit is coupled to the second capacitor plate, the second detection circuit processes the electrical signal corresponding to the second capacitance and outputs a second voltage signal;

an output end of the first detection circuit is connected to a first input end of the micro control unit, an output end of the second detection is connected to a second input end of the micro control unit; the micro control unit compares the first voltage signal and the second voltage signal, and determines the position of the object according to the result of the comparison;

the first detection circuit comprises a first oscillator, the second detection circuit comprises a second oscillator, an input end of the first oscillator connected to a first Pulse Width Modulation (PWM) channel of the micro control unit, an input end of the second oscillator connected to a second PWM channel;

the stud sensor further comprises a power supply module which is respectively connected to the micro control unit, the first detection circuit and the second detection circuit so as to supply power;

the power supply module comprises a power supply and a regulated power supply chip, the power supply connected to an input end of the regulated power supply chip, an output end of the regulated power supply chip respectively connected to the micro control unit, the first detection circuit and the second detection circuit.

2. The stud sensor according to claim 1, wherein the micro control unit is an Analog Digital (AD) micro control unit.

3. The stud sensor according to claim 2, wherein the first capacitor plate and the second capacitor plate have identical structural parameters and permittivity.

4. The stud sensor according to claim 1, wherein the first capacitor plate and the second capacitor plate have identical structural parameters and permittivity.

5. The stud sensor according to claim 4, wherein, on the detection face, the first capacitor plate and the second capacitor plate are arranged in parallel.

6. The stud sensor according to claim 5, wherein the micro control unit determines the central position of the object when the first voltage signal and the second voltage signal are equal.

7. The stud sensor according to claim 4, wherein each element and connections between each element in the first detection circuit and the second detection circuit are all identical.

8. The stud sensor according to claim 4, wherein the stud sensor further comprises an output module, an input end of the output module connected to an output end of the micro control unit.

9. The stud sensor according to claim 8, wherein the output module is a display.

10. The stud sensor according to claim 4, wherein the stud sensor further comprises an input module, an output end of the input module connected to a third input end of the micro control unit.

11. The stud sensor according to claim 10, wherein the input module is a keyboard.

12. The stud sensor according to claim 1, wherein the first oscillator and the second oscillator are both RC oscillators.

13. The stud sensor according to claim 1, wherein an output end of the first oscillator is connected to the first capacitor plate, an output end of the second oscillator is connected to the second capacitor plate.

14. The stud sensor according to claim 13, wherein the first detection circuit includes a first flip-flop, the output end of the first oscillator connected to a first input end of the first flip-flop; the second detection circuit comprises a second flip-flop, the output end of the second oscillator connected to a first input end of the second flip-flop.

15. The stud sensor according to claim 14, wherein the first flip-flop and the second flip-flop are both CD4093 flip-flops.

16. The stud sensor according to claim 1, wherein the power supply module has an indicator light.

17. The stud sensor according to claim 1, wherein the power supply is a battery pack.

* * * * *